(12) United States Patent
Alrod et al.

(10) Patent No.: US 9,141,524 B2
(45) Date of Patent: Sep. 22, 2015

(54) STORAGE DEVICE AND METHOD INCLUDING ACCESSING A WORD LINE OF A MEMORY USING PARAMETERS SELECTED ACCORDING TO GROUPS OF WORD LINES

(71) Applicant: SANDISK TECHNOLOGIES INC., Plano, TX (US)

(72) Inventors: Idan Alrod, Herzliya (IL); Eran Sharon, Rishon Lezion (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/489,024

(22) Filed: Sep. 17, 2014

(65) Prior Publication Data

US 2015/0006800 A1 Jan. 1, 2015

Related U.S. Application Data

(62) Division of application No. 12/495,502, filed on Jun. 30, 2009, now Pat. No. 8,874,825.

(51) Int. Cl.
*G06F 12/02* (2006.01)
*G11C 16/10* (2006.01)
*G06F 11/10* (2006.01)

(52) U.S. Cl.
CPC ........ *G06F 12/0207* (2013.01); *G06F 11/1068* (2013.01); *G06F 12/0246* (2013.01); *G11C 16/10* (2013.01); *G06F 2212/2022* (2013.01); *G06F 2212/7201* (2013.01)

(58) Field of Classification Search
CPC ............ G06F 11/1068; G06F 2212/72; G06F 2212/7201; G06F 12/0246; G06F 2212/2022; G06F 12/0207; G11C 16/10

USPC .............. 711/5, 103; 365/51, 185.11, 185.33; 714/6.24

See application file for complete search history.

(56) References Cited

U.S. PATENT DOCUMENTS

| | | | |
|---|---|---|---|
| 5,295,107 A | 3/1994 | Okazawa et al. | |
| 5,544,356 A | 8/1996 | Robinson et al. | |
| 5,751,637 A | 5/1998 | Chen et al. | |
| 5,880,996 A | 3/1999 | Roohparvar | |
| 6,260,102 B1 | 7/2001 | Robinson | |
| 6,515,909 B1 | 2/2003 | Wooldridge | |
| 6,731,221 B1 | 5/2004 | Dioshongh et al. | |
| 6,732,221 B2 * | 5/2004 | Ban ............................. | 711/103 |
| 7,020,017 B2 | 3/2006 | Chen et al. | |

(Continued)

OTHER PUBLICATIONS

Notice of Allowance and Fee(s) Due mailed Jun. 17, 2014 in U.S. Appl. No. 12/495,502, 5 pages.

(Continued)

*Primary Examiner* — Tuan Thai
*Assistant Examiner* — Glenn Gossage
(74) *Attorney, Agent, or Firm* — Toler Law Group, PC

(57) ABSTRACT

A data storage device and method of accessing a word line of a memory array using values of one or more parameters based on a physical location of the word line. The method includes determining a block identifier of a physical block of a memory array that is to be accessed. The method further includes determining a word line index of a first word line within the physical block based on the block identifier and further based on a first position of the first word line within the physical block. The method further includes accessing the first word line using a first value of the first parameter.

20 Claims, 9 Drawing Sheets

(56) References Cited

U.S. PATENT DOCUMENTS

| | | | |
|---|---|---|---|
| 7,120,051 | B2 | 10/2006 | Gorobets et al. |
| 7,139,864 | B2 | 11/2006 | Bennett et al. |
| 7,369,440 | B2 | 5/2008 | Shappir et al. |
| 7,675,783 | B2 | 3/2010 | Park et al. |
| 7,904,790 | B2 | 3/2011 | Lee et al. |
| 8,136,014 | B2 | 3/2012 | Uchikawa et al. |
| 2005/0226050 | A1 | 10/2005 | Crosby |
| 2008/0062768 | A1* | 3/2008 | Li et al. ............. 365/185.19 |
| 2008/0092015 | A1 | 4/2008 | Brandman et al. |
| 2008/0270730 | A1 | 10/2008 | Lasser et al. |
| 2009/0147582 | A1 | 6/2009 | Aritome |
| 2009/0175112 | A1* | 7/2009 | Ang et al. ............. 365/226 |
| 2009/0273977 | A1 | 11/2009 | Kim et al. |
| 2010/0131697 | A1 | 5/2010 | Alrod et al. |

OTHER PUBLICATIONS

Non-Final Office Action mailed Nov. 22, 2013 in U.S. Appl. No. 12/495,502, 7 pages.
Final Office Action mailed Jul. 8, 2013 in U.S. Appl. No. 12/495,502, 33 pages.
Non-Final Office Action mailed Nov. 9, 2012 in U.S. Appl. No. 12/495,502, 34 pages.
Final Office Action mailed May 21, 2012 in U.S. Appl. No. 12/495,502, 27 pages.
Non-Final Office Action mailed Dec. 13, 2011 in U.S. Appl. No. 12/495,502, 19 pages.
Restriction Requirement mailed Oct. 13, 2011 in U.S. Appl. No. 12/495,502, 6 pages.

* cited by examiner

STORAGE DEVICE AND METHOD INCLUDING ACCESSING A WORD LINE OF A MEMORY USING PARAMETERS SELECTED ACCORDING TO GROUPS OF WORD LINES

CROSS-REFERENCE TO RELATED APPLICATIONS

The present application is a divisional application of and claims priority to U.S. patent application Ser. No. 12/495,502, filed Jun. 30, 2009, now U.S. Pat. No. 8,874,825, the contents of which are incorporated by reference herein in their entirety.

FIELD OF THE DISCLOSURE

The present disclosure is generally related to semiconductor memory.

BACKGROUND

Non-volatile semiconductor memory devices, such as removable storage cards or Universal Serial Bus (USB) flash memory devices, have enabled increased portability of data and software applications. Data storage densities of non-volatile semiconductor memory devices are generally increasing and support greater performance in portable electronic devices. Some features that enable higher density, such as multi-level cell technologies, may also cause increased design complexity to maintain robust operation of the memory device. To illustrate, flash memory devices may use many parameters, such as programming step size or codeword size, to control memory access operations.

Values of such parameters may be chosen based on one or more reliability criteria of the flash memory device. As a result, the parameter values may be selected based on the behavior of a very small number of memory cells (i.e. the cells with weak reliability) as compared to the majority of memory cells of the flash memory device. In such cases, ensuring reliable operation of the flash memory device for every memory cell may cause the device to operate at a lower overall performance level.

SUMMARY

Memory operations for a semiconductor memory device using location-based parameters are disclosed. One or more parameter values used during a memory access operation may be determined at least partially based on a physical location of a block of memory to be accessed. As a result, at least two blocks in a memory are handled differently depending on their physical location in the semiconductor memory.

DETAILED DESCRIPTION

Figure 1:
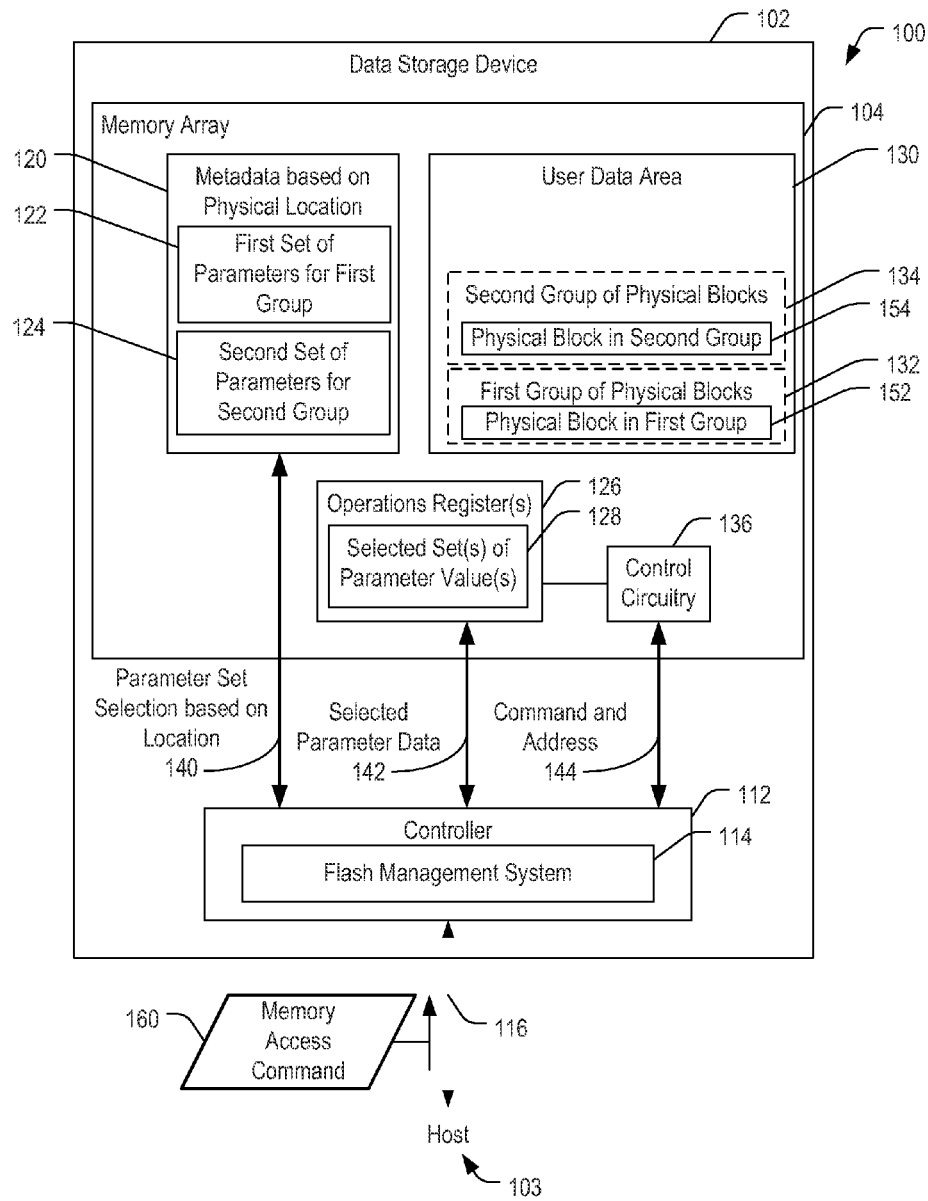
FIG. 1 is a block diagram of a first particular embodiment of a system to perform memory operations using location-based parameters.

FIG. 1 depicts a first illustrative embodiment of a system 100 that includes a data storage device having location-based physical parameters. The data storage device 102 is in communication with a host 103 via a bus or communication channel 116. The data storage device 102 includes a memory array 104 and a controller 112. The controller 112 includes a flash management system 114. The memory array 104 includes metadata based on physical location 120, user data area 130, operations register(s) 126, and control circuitry 136. The user data area 130 includes a first group of physical blocks 132 and a second group of physical blocks 134. As illustrated, the first group of physical blocks 132 includes physical blocks in an edge region of the memory array, such as a representative physical block 152 in the first group. The second group of physical blocks 134 includes physical blocks of the memory array 104 that are physically located in a second region, such as a group of physical blocks in a central area of the memory array 104. The second group of physical blocks 134 includes a representative physical block 154 in the second group.

Access to physical blocks of the first group of physical blocks 132 or the second group of physical blocks 134 is performed using one or more location-based parameter values that are retrieved from the metadata based on physical location 120 and stored to the operations register(s) 126. For example, in response to a memory access command 160 that is received from the host 103 via a bus or communication channel 116, the flash management system 114 executed by the controller 112 may be operative to retrieve either a first set of parameters 122 corresponding to the first group of physical blocks 132 or a second set of parameters 124 corresponding to the second group of physical blocks 134. The first set of parameters 122 and the second set of parameters 124 may each contain a value of a single parameter (i.e. a set of one parameter value) or values of multiple parameters (e.g. a set of multiple parameter values). The controller 112 may retrieve the selected set of parameters 140 based on the location of a physical block to be accessed in response to the memory access command 160. One or more selected sets of parameter values 128 from the parameter set selection may be communicated from the controller 112 as selected parameter data 142 and stored at the operations register(s) 126. The control circuitry 136 may be responsive to commands from the controller 112, such as command and address communications 144, to retrieve the selected set(s) of parameter values 128 from the operations register(s) 126 and to perform memory read and write operations at the user data area 130 using the retrieved parameter values.

The first representative physical block 152 in the first group of physical blocks 132 and the second representative physical block 154 in the second group of physical blocks 134 may include storage devices that are manufactured with a substantially similar design and dimensions. However, one or more physical characteristics of the memory cells of the first physical block 152 in the first group of physical blocks 132 may differ from the second physical block 154 in the second group 134 as a result of variations (e.g. process variations) that may be attributable to a difference in the location of the first and second physical blocks 152, 154.

For example, the memory array 104 can include the first physical block 152 that is associated with a first parameter value based on a first physical location of the first physical block 152 within a memory die containing the first physical block 152. The second physical block 154 can be associated with a second parameter value based on a second physical location of the second physical block 154 within the memory die. The first parameter value is provided by the controller 112 to the control circuitry 136 to control at least one operation at the first physical block 152. For example, the first parameter value may be provided in the selected parameter data 142 and stored in the operations register(s) 126 within the selected set(s) of parameter values 128. Similarly, the second parameter value associated with the second physical block 154 may be stored in the operation register(s) 126 when the data access operation at the second physical block 154 is implemented. To illustrate, the first set of parameters 122 may be retrieved and used for physical blocks that exist at an edge region, such as physical blocks of the first group of physical blocks 132, while the second set of parameters 124 may be used for memory access operations at the second group of physical blocks 134 that are in a central region of the memory array 104.

The first parameter value may be different from the second parameter value due to a difference in characteristics exhibited by memory cells in the first group of physical blocks 132 as opposed to the second group of physical blocks 134 resulting from location-based differences in the devices. For example, the first physical location of the first physical block 152 may be within an edge area of the memory array 104, while the second physical location of the second physical block 154 may be within a central area of the memory array 104. To illustrate, small irregularities in the fabrication process and variations in the die properties may be more pronounced in an edge area of a semiconductor die and result in different memory operating parameters. However, the first and second physical locations are not to be limited to an edge region or central region of memory array 104. For example, the first physical location may be within an edge area of a plane of the memory array 104, such as will be described with respect to planes 320 and 322 depicted in FIG. 3.

The data storage device 102 may be configured such that even-numbered pages are handled differently than odd-numbered pages, and even-numbered pages in two different physical blocks may be handled differently from each other according to the two blocks' physical location. Similarly, odd-numbered pages in different physical blocks may also be handled differently from each other according to the physical locations of the physical blocks.

One example of a flash memory parameter that may be classified according to physical location dependency is a programming step size. To illustrate, different physical blocks may be measured to have different reliabilities and therefore a standard deviation of the cell-voltage distribution (CVD) is different for the different physical blocks. For example, for a data read operation the different physical blocks may exhibit a different number of bit errors. The CVD can be a probability density function of a threshold read voltage of cells programmed to the same voltage state (e.g. two states in a single-level cell and four or more states in a multi-level cell) and can provide a width or spread of read levels associated with programmed states. Physical blocks that have a smaller average of the standard deviation of the CVD may be determined to be more reliable, and the controller 112 may use larger programming step sizes for these physical blocks so that the standard deviation of the CVD is substantially equivalent among each of the blocks in the memory array 104 under substantially equivalent conditions (e.g. substantially same number of program/erase cycles and data retention).

Block reliability can correspond to physical locations of the blocks, and therefore the programming step size parameter can also be determined based on physical location. As a result, the controller 112 can increase the programming speed on the more reliable blocks by using a larger programming step size and use smaller programming step sizes on less reliable blocks to maintain substantially equal reliability among the different blocks. In this manner, an average programming speed can be increased while a reliability of the data storage device 102 is maintained.

Although FIG. 1 illustrates location-based parameter values associated with groups of physical blocks according to the location of the physical blocks, in other embodiments location-based parameter values may be associated with groups of word lines (WLs) according to the location of the word lines within the memory array 104. For example, a first group of WLs may include word lines from multiple blocks that have at least one common location-based parameter value (e.g. associated with a read, program, or erase command) that is different from the parameter value for a second group of WLs from the same blocks as the first group, as will be described in further detail with respect to FIGS. 5 and 9.

Figure 2:
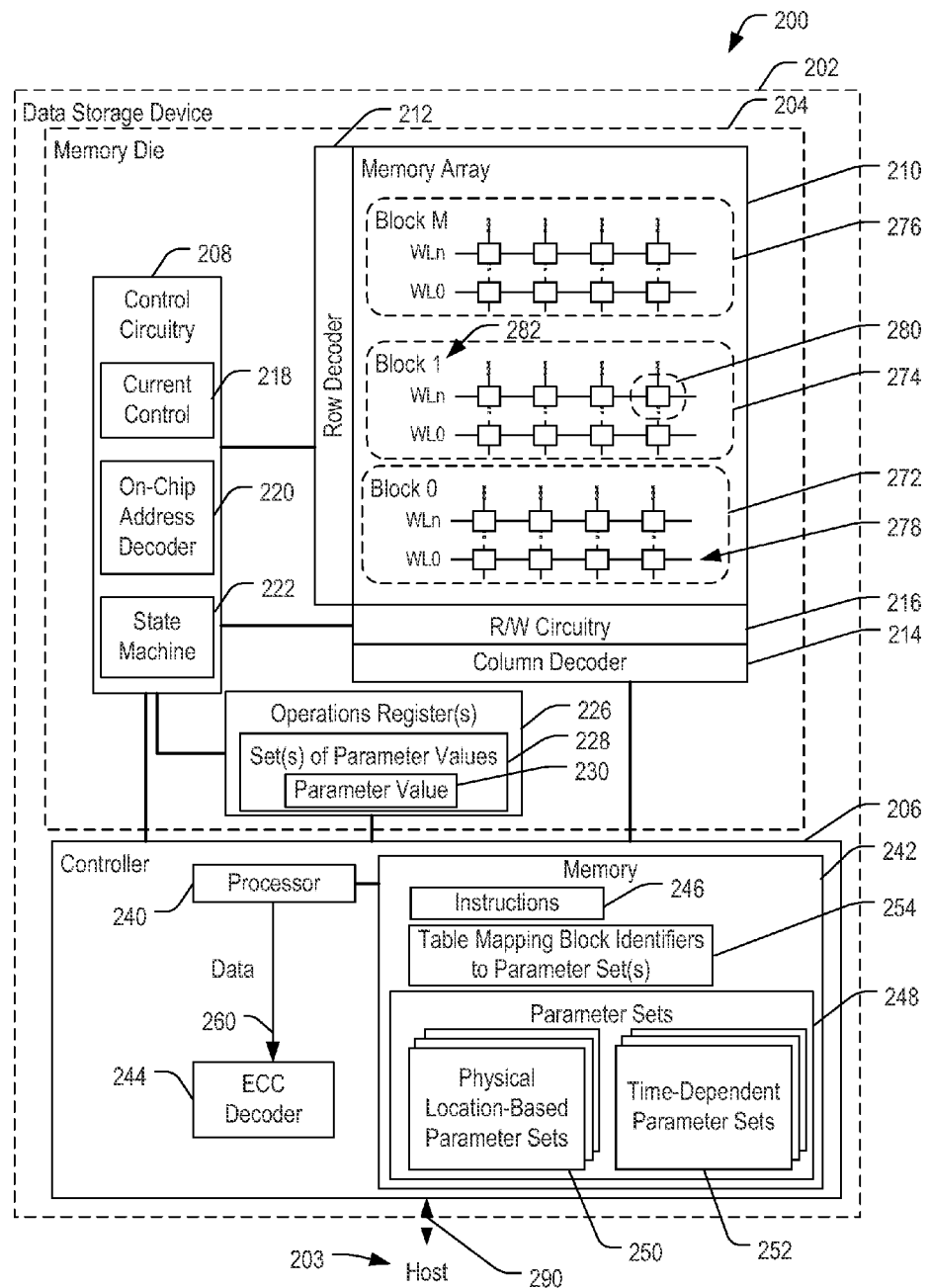
FIG. 2 is a block diagram of a second particular embodiment of a system to perform memory operations using location-based parameters.

Referring to FIG. 2, a second illustrative embodiment of a system including a data storage device having access based on physical location of physical blocks is depicted and generally designated 200. The system 200 includes a data storage device 202 in communication with a host 203 via a communication channel 290. The data storage device 202 includes a controller 206 in communication with one or more memory dies, such as a representative memory die 204. The controller 206 is configured to receive memory access requests from the host 203 and to perform memory access operations at one or more memory arrays, such as the memory array 210 of the memory die 204, using sets of parameter values that are based on physical locations of physical blocks of the memory array 210. As an illustrative, non-limiting example, the data storage device 202 may be the data storage device 102 of FIG. 1.

The controller 206 includes a processor 240 in communication with a memory 242 and in communication with an Error Correction Code (ECC) decoder 244. The memory 242 stores executable instructions 246 that may be executed by the processor 240 to perform one or more operations of the controller 206. The memory 242 also includes a table 254 mapping block identifiers to one or more parameter sets. The memory 242 further includes parameter sets 248, such as physical location-based parameter sets 250 and time-dependent parameter sets 252.

The processor 240 may be configured to determine a location of one or more physical blocks corresponding to a memory access request and retrieve an identifier of the physical block. The processor 240 may be configured to access the table 254 mapping the block identifier to a parameter set and retrieve one or more of the physical location-based parameter sets 250 to be provided to operations register(s) 226 of the memory die 204 for memory access operations. The processor 240 may also be configured to access one or more of the time-dependent parameter sets 252 to retrieve one or more time-dependent parameter values, such as parameter values that change or are updated based on a number of erase cycles at the block. The processor 240 may be configured to receive data including error correction data from the memory array 210 in response to a memory read request and to perform an error check by providing the data 260 to the ECC decoder 244.

The memory die 204 includes the memory array 210, control circuitry 208, and read/write circuitry 216. The memory array 210 may be a two-dimensional array or a three-dimensional array of memory cells. The memory array 210 is addressable by word lines via a row decoder 212 and by bit lines via a column decoder 214. The read/write circuitry 216 may be operative to enable a page of memory cells to be read or programmed.

The control circuitry 208 cooperates with the read/write circuitry 216 to perform memory operations at the memory array 210. The control circuitry 208 includes a state machine 222, an on-chip address decoder 220, and a current control module 218. The state machine 222 may provide chip-level control of memory operations. The on-chip address decoder 220 may provide an address interface between an address used by the host 203 or a memory controller to the hardware address used by the decoders 212 and 214. The current control module 218 may control the current and/or voltages supplied to the word lines and bit lines of the memory array 210 during memory operations.

The memory array 210 includes multiple physical blocks, illustrated as a first physical block (Block 0) 272, a second physical block (Block 1) 274, and a last physical block (Block M) 276. Block 0 272 includes multiple word lines, such as a representative word line (WL0) 278. Block 0 272 may be physically closest to a first edge of the memory array 210 compared to other blocks. Block 1 274 may be physically adjacent to Block 0 272 and may include multiple word lines. Each word line includes one or more memory cells, such as a representative memory cell 280. The memory array 210 may include any number of additional physical blocks (not shown). The last memory block, Block M 276, may be a last memory block that is physically closest to a second edge area of the memory array 210, and physically located furthest from Block 0 272.

The memory die 204 also includes one or more operation registers 226. The operation registers 226 may be accessible to the controller 206 and the control circuitry 208, and may be loaded with one or more sets of parameter values 228, including a particular parameter value 230 that is determined based on the physical location of a physical block of the memory array 210 to be accessed.

During operation, the controller 206 may receive a memory access command from the host 203. The controller 206 may identify a block identifier corresponding to a physical block of the memory array 210 to be accessed. For example, the block identifier may be the identifier 282 of the second block (Block 1) 274. The identifier 282 may have a numeric value, an alphanumeric value, another indicator value, or any combination thereof. The controller 206 may initiate a table lookup at the table 254 that maps the block identifiers to the parameter sets using the identifier 282 to locate a physical location-based parameter set 250 associated with Block 1 274. The controller 206 may write the identified physical location-based parameter set based on the identifier 282 to the operation registers 226 as the set of parameter values 228. The controller 206 may instruct the control circuitry 208 to perform a memory read or write command including access to the representative memory cell 280 of the identified block 274. The control circuitry 208 may perform a data read or write operation using the particular parameter value 230 of the set of parameter values 228 that is determined based on the physical location of the identified block 274.

The physical location-based parameter sets 250 may be used in response to, or in conjunction with, various types of access operations such as a read operation, a write operation, an erase operation, or any combination thereof. A result of the memory access operation, such as data read from the memory in response to a data read command, is returned to the controller 206 and is provided as the data 260 to the ECC decoder 244. The ECC decoder 244 may identify one or more errors associated with the received data 260. For example, the ECC decoder 244 may identify a number of data errors exceeding a predetermined threshold. In response, the processor 240 may be operative to update one or more parameter values, such as the parameter value 230, of the physical location-based parameter sets 250 associated with the physical location of the specified block 274. One or more of the parameter values may not be known during manufacture and may be acquired by the controller 206 during operation of the data storage device 202. As an example, ECC related parameter values may be acquired during operation. As another example, during a read operation, the number of cells attributed to one of the programmed states may be identified as larger than the number of cells in other states. The verify voltage threshold of that particular WL may be set to allow for a larger voltage band for that state and correspondingly reduced voltage band of other programmed states.

The first parameter value 230 may include an error correction coding parameter value or an error correction decoding parameter value, in an illustrative example. The error correction decoding parameter value may be used and updated as a result of physical location differences, such as a difference that would indicate a higher or lower accuracy of data retention, which may result in higher performance due to a modified version of the error correction decoding parameter value. As a result of identifying and adjusting the parameter value 230 for the specified block 274, the parameter value 230 may be updated for all blocks sharing similar physical characteristics based on the physical location of the block within the memory die 204.

Although the system 200 is illustrated as performing a lookup operation at the table 254 to identify a physical location-based parameter set, in other embodiments one or more parameter values may be determined as a function of a physical block identifier. For example, where the physical block identifier includes a block number, one or more parameter values may be computed as a function of the block number.

Figure 3:
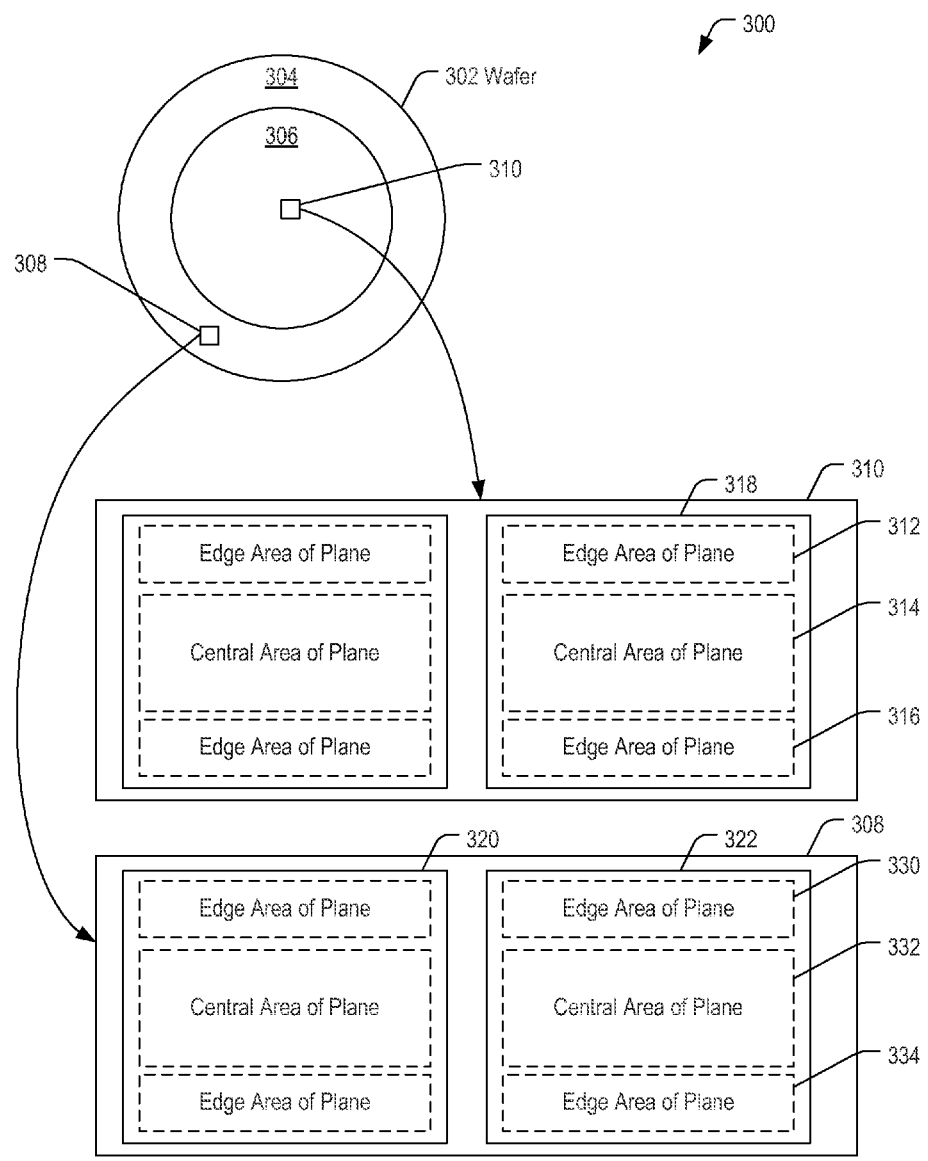
FIG. 3 is a diagram depicting physical regions associated with a semiconductor die.

Referring to FIG. 3, an illustration of physical locations that may be used to identify values of location-based parameters is depicted and generally designated 300. A wafer 302 is illustrated as having an edge region 304 and an interior or central region 306. A first memory die 308 is illustrated as being formed from within the edge region 304 of the wafer 302. A second memory die 310 is illustrated as being formed within the central region 306 of the wafer 302. The first memory die 308 includes multiple memory planes, illustrated as a first plane 320 and a second plane 322. Each of the first plane 320 and the second plane 322 is illustrated as having multiple areas, such as a top edge area 330 of the plane 322, a central area 332 of the plane 322 and a second or bottom edge area 334 of the plane 322. The second memory die 310 includes multiple memory planes, including a representative memory plane 318 having a top edge area 312 of the plane 318, a central area 314 of the plane 318, and a second or bottom edge area 316 of the plane 318.

Memory cells at one or more memory blocks within the first edge region 312 may have physical characteristics that are location-based and that are different from corresponding parameter values of devices at the central region 314. Similarly, parameter values of memory cells at the central region 314 may be distinct from the parameter values corresponding to memory cells at the second edge region 316, again based on physical location differences between the memory blocks of the first edge region 312, the central region 314, and the second edge region 316. The values of a corresponding parameter of memory cells at the edge areas 330 and 334 of the plane 322 may be similar to or different from each other and may also be different from the parameter value of memory cells in the central area 332 of the plane 322. Further, parameter values may differ according to whether a physical block is located on the first memory die 308 or the second memory die 310 based on the die's location on the wafer 302, as will be described in reference to FIG. 4.

Figure 4:
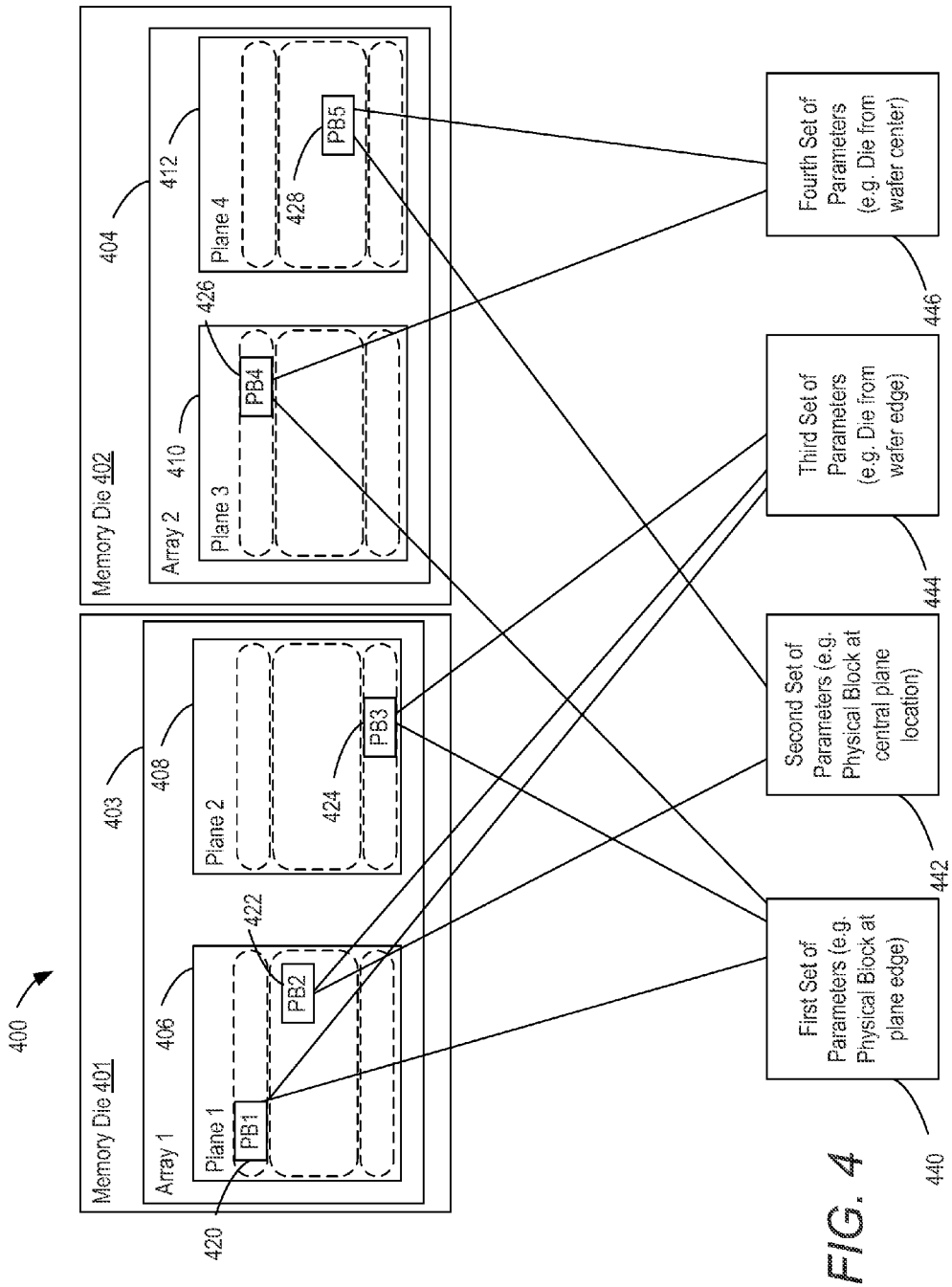
FIG. 4 is a block diagram of a particular embodiment of location-based parameters corresponding to a memory array.

Referring to FIG. 4, an illustration of a system including a first memory die 401, a second memory die 402, and multiple sets of parameters that are location-based is depicted and generally designated 400. The first memory die 401 includes a first memory array 403 that includes a first plane 406 and a second plane 408. The second memory die 402 includes a second memory array 404 including a third plane 410 and a fourth plane 412. The system 400 includes multiple sets of location-based parameters, including a first set of parameters 440, a second set of parameters 442, a third set of parameters 444, and a fourth set of parameters 446.

A first representative physical block (PB1) 420 is depicted as being within an edge area of the first plane 406 of the first memory array 403 of the first memory die 401. The first physical block 420 may correspond to the first set of parameters 440. For example, the first set of parameters 440 may include parameter values for physical blocks at edges of planes of the memory. In addition, the first physical block 420 may also correspond to the third set of parameters 444. For example, the third set of parameters 444 may include parameter values for memory dies that are formed from an edge region of a wafer, as opposed to a central region of the wafer. Thus, some physical parameters may have values that are controlled with respect to location within a plane of a memory array, while other parameters may have values that depend on a die's location within the wafer.

A second representative physical block (PB2) 422 is illustrated as within a central area of the first plane 406 of the first memory array 403 of the first memory die 401. The second physical block 422 is associated with the second set of parameters 442. For example, the second set of parameters 442 may be associated with physical blocks within a central plane location. In addition, the second representative physical block 422 may also be associated with the third set of parameters 444 because the second physical block 422 is on the first memory die 401 that was formed at an edge region of a wafer.

A third representative physical block (PB3) 424 is illustrated as corresponding to the first set of parameters 440 due to being at an edge region of the second plane 408 and also corresponding to the third set of parameters 444, due to being within the first memory die 401 that was formed at a wafer edge region. A fourth representative physical block (PB4) 426 is illustrated within the second memory die 402, in the third plane 410, and may be associated with the first set of parameters 440 due to the fourth physical block 426 being within an edge region of the third plane 410. The fourth physical block 426 may also be associated with the fourth set of parameters 446. For example, the fourth set of parameters 446 may be associated with dies formed from a central region of a wafer.

A fifth representative physical block (PB5) 428 is illustrated as within a central region of the fourth plane 412 of the second memory die 402 and may therefore be associated with the second set of parameters 442 due to a central plane location and may also be associated with the fourth set of parameters 446 due to the second memory die 402 being formed from a central region of a wafer.

FIG. 4 demonstrates how one or more types of physical locations may be associated with one or more physical blocks within a memory array. Although four sets of parameters are depicted, in other embodiments fewer than four sets or more than four sets of parameters may be included. Also, although two sets of parameters are depicted for each category of location (e.g. one set for edge of plane and one set for center of a plane) in other embodiments three or more distinct sets of parameters may be associated with each category of location, and the sets of parameters need not be generally classified as edge and center-type categories. In addition, although each representative physical block is depicted as associated with multiple parameter sets, in other embodiments each block may be associated with only one parameter set. As an illustrative, non-limiting example, a parameter set could include values for memory cells located at an edge of a plane that came from a central region of a wafer.

Although FIG. 4 depicts each of the sets of parameters 440-446 as including a value of one or more parameters corresponding to a physical location, in other embodiments each set of parameters 440-446 may correspond to a single parameter value. For example, the first set 440 may be a first value of a parameter and the second set 442 may be a second value of the same parameter, where the first value is more appropriate for WLs or blocks in an edge area of the first memory array 403 or the second memory array 404 and the second value is more appropriate for WLs or blocks in a central area of the first memory array 403 or the second memory array 404. Thus, each WL or block may include, for the particular location-based parameter, a "tag" or pointer to one of the associated sets 440 or 442 (i.e. the pointer indicating the appropriate parameter value). For multiple location-based parameters, each WL or block may include multiple such pointers, each pointer associated with a corresponding location-based parameter and indicating a particular option for the corresponding parameter.

Figure 5:
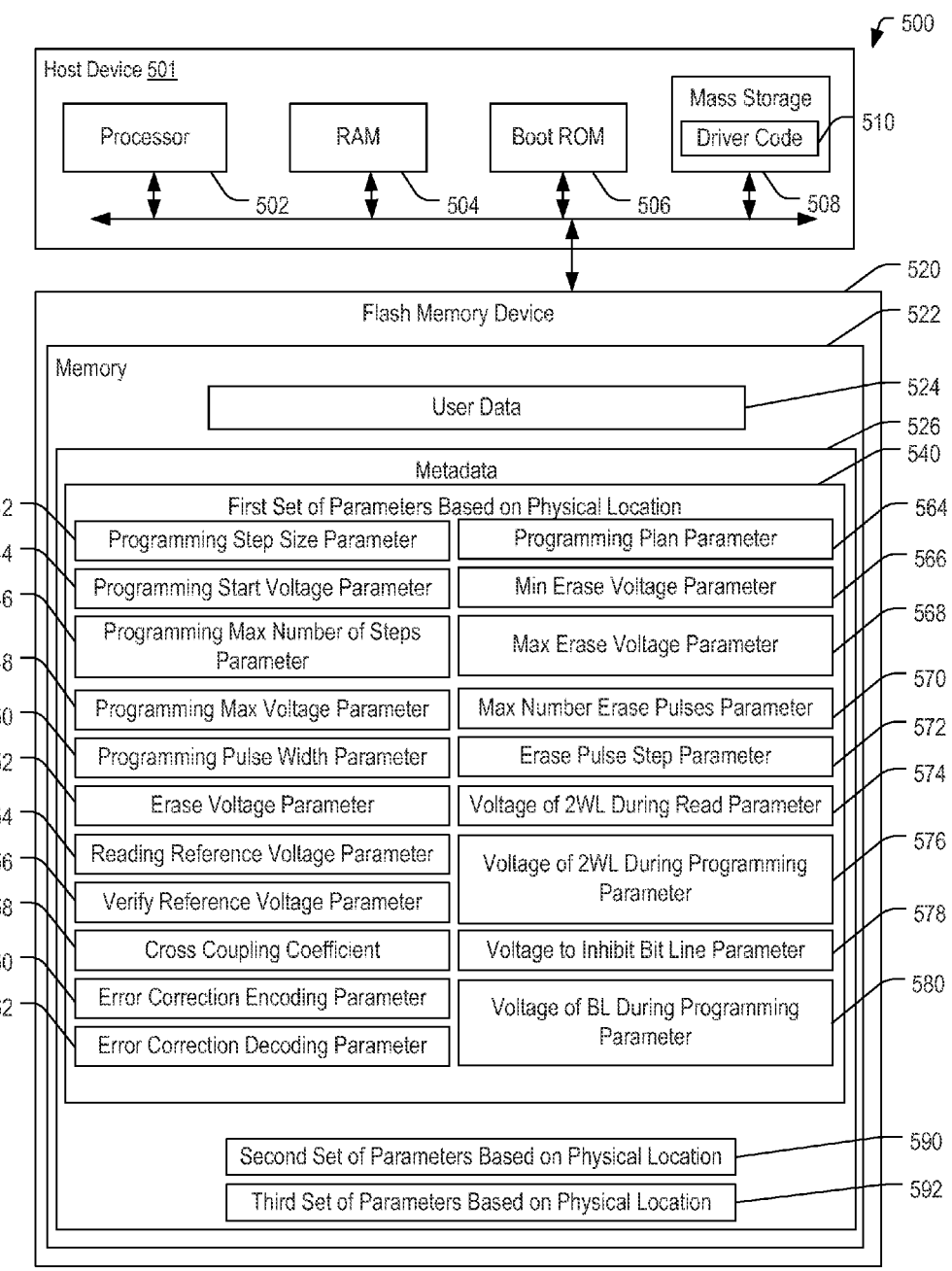
FIG. 5 is a block diagram of a third particular embodiment of a system to perform memory operations using location-based parameters.

Referring to FIG. 5, an illustrative embodiment of a system including a flash memory device using parameters based on physical location is depicted and generally designated 500. The system 500 includes a host device 501 such as a personal computer (PC) including a processor 502, a random access memory (RAM) 504, a boot read-only memory (ROM) 506, and a mass storage 508 such as a hard disk drive or internal flash memory. The host device 501 is coupled to a removable flash memory device 520 and the flash memory device 520 is accessible to the processor 502 via an internal bus of the host device 501. The flash memory device 520 includes a memory 522 that stores user data 524 and metadata 526.

The mass storage 508 includes driver code 510 that may be executable by the processor 502 to perform memory operations at the flash memory device 520. The driver code 510 may be executable by the processor 502 to determine a physical location of a physical block to which memory access is to be performed. For example, the location of the block may be determined using a block identifier, such as calculated based on a block identifier, or retrieved via a lookup operation indexed by the block identifier. The driver code 510 may be executable by the processor 502 to retrieve one of a first set of parameters 540 based on physical location, a second set of parameters 590 based on physical location, or a third set of parameters 592 based on physical location. One or more of the first set of parameters 540, the second set of parameters 590, or the third set of parameters 592 may be retrieved based on the determined location of the physical block.

The first set of parameters 540 based on physical location includes a plurality of different parameters. For example, the plurality of different parameters may include one or more values corresponding to a programming step size parameter 542, a programming start voltage parameter 544, a programming maximum number of steps parameter 546, a programming maximum voltage parameter 548, a programming pulse width parameter 550, an erase voltage parameter 552, a reading reference voltage parameter 554, a verify reference voltage parameter 556, a cross coupling coefficient 558, an error correction encoding parameter 560, and an error correction decoding parameter 562. The first set of parameters 540 based on physical location also includes additional parameters such as one or more values corresponding to a programming plan parameter 564, a minimum erase voltage parameter 566, a maximum erase voltage parameter (or maximum absolute value of the erase voltage when the erase voltage has a negative value) 568, a maximum number of erase pulses parameter 570, and an erase pulse step parameter 572. In addition, the plurality of parameters may further include one or more values corresponding to a voltage of a second word line that is applied to the second WL during read parameter 574, a voltage of a second word line that is applied to the second WL during programming parameter 576, a voltage to inhibit bit line parameter 578, and a voltage of a bit line during programming parameter 580. Although parameters indicating values applied to a second WL are depicted, a set of voltages may be applied to other WLs based on the distance of the other WLs from the target WL. Similarly, the bitline voltage may have several values during programming (and not only two each) that may be configured based on physical location.

Thus, the metadata 526 within the memory 522 may store a plurality of different types of parameters that are based on physical location as illustrated. One or more values of the various parameters may be used during memory device operation and may be adjustable or programmable in certain circumstances. As a further example, one or more of the physical locations may be tied to the physical location-based parameters, such as the physical location-based set 250 of FIG. 2 and the first and second parameter sets 122, 124 referred to in FIG. 1.

As a specific example, the error correction encoding parameter 560 may include a codeword size, a codeword parity size, another parameter related to error correction encoding, or any combination thereof. As another example, the error correction decoding parameter 562 may include a number of soft bits (resolution bits) to be used in decoding, a maximal number of iterations for decoding, a maximal number of bit errors the decoder is set to correct, another parameter related to error correction decoding, or any combination thereof.

Currently, ECC design based on a worst-case performance of a block of a memory may take no advantage from the fact that other blocks with improved reliability could be encoded with less redundancy bits. Performance improvements may be obtained using a tagging mechanism to define groups of blocks according to their reliability (derived based on their physical location in the die), holding the number of redundancy bits as the side information or metadata in the set of memory operating parameters.

Using the system 200 of FIG. 2 as an example, rather than accessing the table 254 mapping block identifiers to parameter sets, a group identifier for a block may be stored with the side information for that block that is stored in the memory array 210. Using such a tagging mechanism can reduce storage space as compared to storing one or more parameter values in the side information for each block. The tagging mechanism enables grouping of blocks sharing the same parameter value into common groups and storing an identifier or group ID to which each block belongs rather than actual parameter values for each block.

Determination of memory access parameters based on physical location can be used even when different WLs within the same block are to be handled differently when there are at least two blocks in which grouping of WLs is different according to the blocks' locations. As an example of how such embodiment can be implemented, the number of a WL in the entire flash device can be denoted as the index of the WL. For example if there are 'n' blocks in the flash memory device and each block holds 'm' WLs, then the WL index of a WL at block 'k' (k<n, 'k' starts from zero) and WL 'j' (j<m, j starts from zero) is k×m+j.

In yet another embodiment, in order to efficiently assign different parameters to different block or WL indexes, these block or WL indexes are grouped together. A large number of WL indexes or blocks can be linked to each group. As a result, a total number of parameters to be stored in the flash device can be significantly reduced. One of the methods to allocate a (tag) group number for each WL index is to maintain a fixed size table in which every entry in the table corresponds to a set of flash parameters best suited to operate the members in the group.

The tagging operation (deciding which WLs point to which group) to determine the set of memory operating parameters per WL (or block) can include first identifying what is the substantially most effective or optimal set for each WL/block. This optimal set can be compared to the fixed set of options set aside in the table. The tagging can point each group to the option in the fixed set which is closest (according to whatever criteria is defined) to the acquired optimal set of memory operating parameters. The size of each entry in the fixed set (allocated for the flash parameters) and the number of entries in that set can be designed for reduction of a largest distance between a desired set of memory operating parameters and the set of memory operating parameters in the chosen entry.

This method for tagging can be particularly suitable when the number of options for selecting the flash parameter is small and the parameter value is known before parameter acquisition is made. Furthermore, the number of bits required to store each option is large and hence a fixed table provides for significant gain in terms of the amount of side information stored in the flash memory for operation. One example of such a parameter is the programming step size.

Another example for the flash parameter computed differently according to WL index or block number is the CCC (Cross Coupling Coefficients). The CCC can be computed for each WL index during production because the CCC typically does not change over the lifetime of the device and has one or more values that are dependent on the physical location of the WL in the device e.g. the WL index.

In this case, the classification (tagging) of the proper set of coefficients represented by each entry in the fixed table may be performed such that for each entry in the table of CCC (there could be several coefficients in each entry corresponding to a number of neighbors for each cell) the average standard deviation of the CVD (Cell Voltage Distribution) of all states is obtained.

This CVD can be obtained by employing the CCC in the entry during read operation of the particular WL. This read operation may be performed immediately after programming the WL, or after programming one or more additional WLs, such that the programmed data is known. A table entry that results in a smallest of the average standard deviation values may be chosen.

In a similar manner, any parameter that may be determined for the entire die, such as placed in a read-only memory (ROM) fuse, can be adapted for each WL (or block) independently using a separate fixed set of memory operating parameters, using the techniques disclosed herein. In this sense, the CCC parameters could also be a reliability measure as a function of the neighbors that are not considered "coefficients" or "correction coefficients."

In another embodiment, a fixed table may not be set aside and instead a maximal table size may be designated. The actual table size may not be determined until production or during device operation when the acquisition of the metadata parameters is performed. A mechanism for jointly filling up the table entries and deciding upon which WL points to which entry includes:

(a) Comparing an acquired set of parameters (e.g. programming pulse width) for a WL (or block) to all sets of parameters already stored in the designated table.

(b) Finding a particular entry in the table that is closest to the acquired set than the other entries in the table. Define this entry as a minimum distance entry having a distance 'd' from the acquired set.

(c) Comparing this distance 'd' to a maximal allowed distance.

(d) If the distance 'd' is smaller than the maximal distance or the number of entries in the table has reached the maximal table size, tag the WL (or block) to the minimum distance entry. Otherwise, place a new entry with the acquired set of parameters into the table and point the block or WL to the new entry.

Classification of parameter values based on physical location may be performed by first classifying according to block number and then adding corrections according to the WL position within the block. This classification can be performed adaptively during the manufacturing process such that the classification varies according to the batch of wafers produced.

Figure 6:
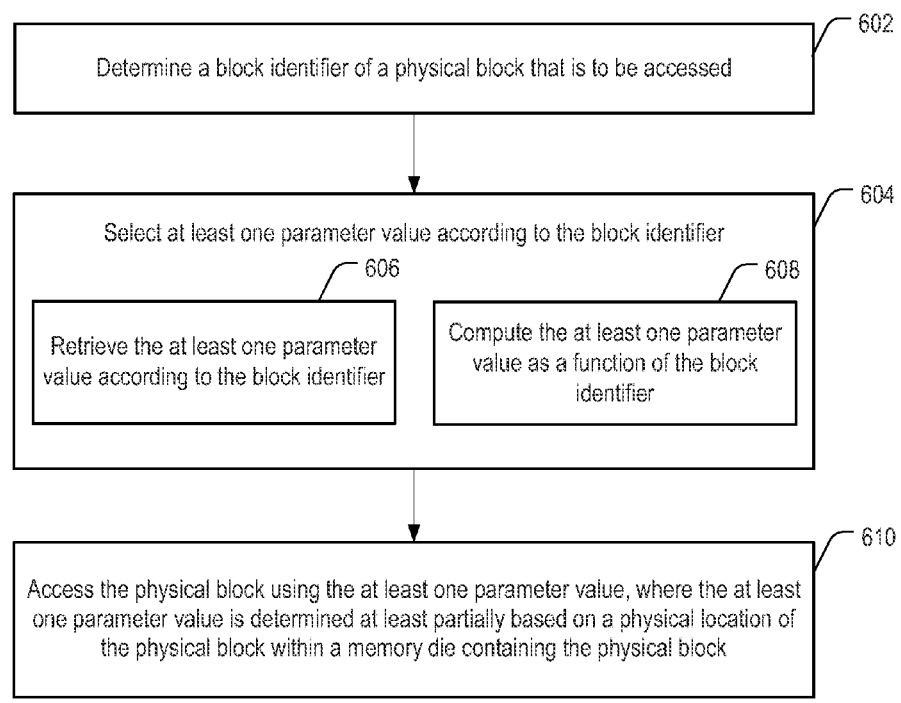
FIG. 6 is a flow diagram of an embodiment of a method of accessing a physical block of a memory die using a location-based parameter.

Referring to FIG. 6, a flow diagram of an embodiment of a method of operating a memory, such as a flash memory, is depicted. The method can be performed at the data storage device 102 of FIG. 1, the data storage device 202 of FIG. 2, or the system 500 of FIG. 5, as illustrative, non-limiting examples.

A block identifier of a physical block that is to be accessed is identified, at 602. At least one parameter value is selected according to the block identifier of the physical block, at 604. For example, the at least one parameter value may be stored in the memory, such as in the first or second set of parameters 122 or 124 of FIG. 1, and retrieved according to the block identifier, at 606. As another example, the at least one parameter value may be computed as a function of the block identifier, at 608. To illustrate, the block identifier may include a number of the physical block, such as the block identifier 282 of FIG. 2.

The memory die may include multiple blocks that are grouped into multiple groups of blocks according to location within the memory die, and selecting the at least one parameter value may include identifying a particular group of blocks that includes the physical block. For example, where the physical block to be accessed is the first physical block 152 of FIG. 1, the first group of physical blocks 132 of FIG. 1 may be identified as containing the first physical block, and the first set of parameters 122 of FIG. 1 may be selected as corresponding to the first group. Of the first set of parameters 122 of FIG. 1, at least one parameter value may be selected and provided to the operations register(s) 126 of FIG. 1.

The physical block is accessed using the at least one parameter value, where the at least one parameter value is determined at least partially based on a physical location of the physical block within a memory die containing the physical block, at 610. For example, the at least one parameter value may be determined at least partially based on whether the physical location of the physical block is within an edge region of the memory array. Accessing the physical block can include reading one or more memory cells within the physical block, programming one or more memory cells within the physical block, erasing data stored at one or more memory cells within the physical block, or any combination thereof.

The at least one parameter value may include a value of at least one of a programming step size, a programming start voltage, a programming maximal number of steps, a programming maximal voltage, a programming pulse width or programming pulse duration, an erasing voltage, a reading reference voltage, a verify reference voltage, a cross coupling coefficient, a parameter related to error correction encoding, a parameter related to error correction decoding, a reliability measure table, a bit reliability measure value corresponding to voltage band, a bit reliability measure value related to neighboring cells, a programming plan or programming sequence, a minimal erase voltage, a maximal erase voltage, a maximal number of erase pulses, an erase pulse step, a voltage applied to a second word line within the physical block when reading cells of a first word line within the physical block, a voltage applied to the second word line within the physical block when programming cells of the first word line within the physical block, a voltage applied to bit lines to inhibit the bit lines in response to the bit lines reaching a designated state, or a voltage applied to the bit lines when programming cells coupled to the bit lines. For example, the parameter related to error correction encoding may include a codeword size or a codeword parity size. As another example, the parameter related to error correction decoding may include a number of soft bits to be used in decoding, a maximal number of iterations for decoding, or a maximal number of corrected bits.

Figure 7:
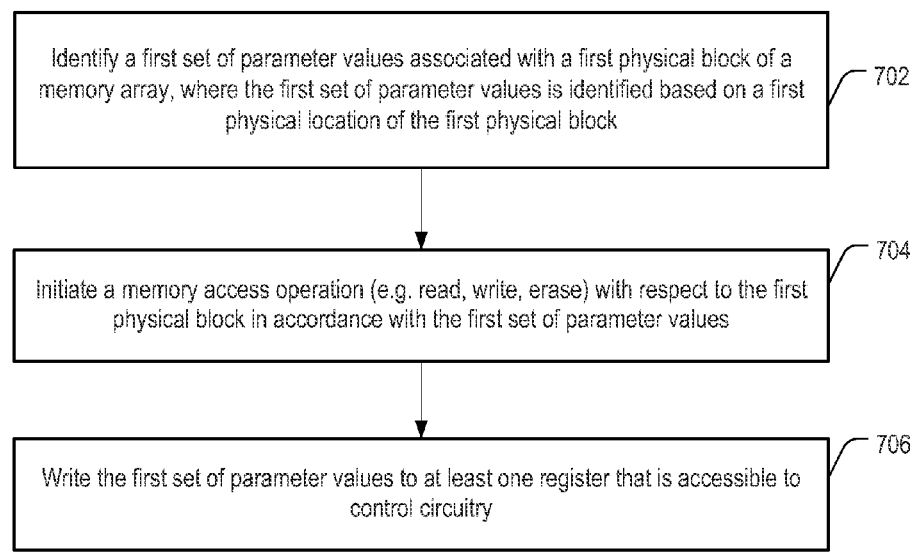
FIG. 7 is a flow diagram of a first embodiment of a method of accessing a physical block of a memory die using a set of parameters based on a physical location.

Referring to FIG. 7, a flow diagram of a method of accessing a physical block of a memory die using a set of parameters based on a physical location is depicted. The method can be performed at the data storage device 102 of FIG. 1, the data storage device 202 of FIG. 2, or the system 500 of FIG. 5, as illustrative, non-limiting examples.

A first set of parameter values associated with a first physical block of a memory array is identified, where the first set of parameter values is identified based on a first physical location of the first physical block, at 702. A memory access operation is initiated with respect to the first physical block in accordance with the first set of parameter values, at 704. The first set of parameter values may be written to at least one register that is accessible to control circuitry, at 706. For example, the selected set of parameter values 128 of FIG. 1 may be selected from the metadata based on physical location 120 and written to the operations register(s) 126 for use during a memory access operation, such as a read, write, or erase operation.

Figure 8:
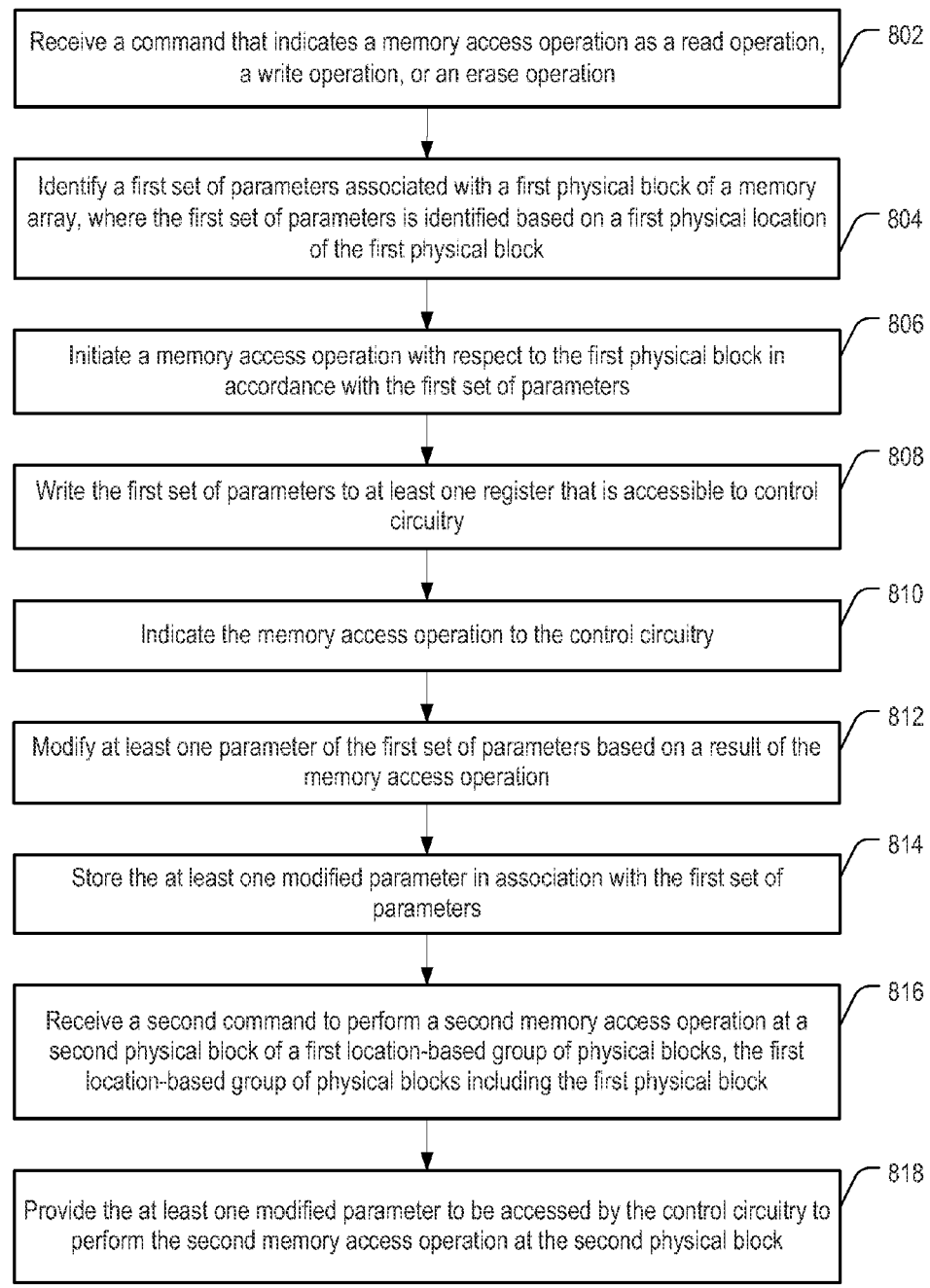
FIG. 8 is a flow diagram of a second embodiment of a method of accessing a physical block of a memory die using a set of parameters based on a physical location.

FIG. 8 is a flow diagram of a second embodiment of a method of accessing a physical block of a memory die using a set of parameters based on a physical location. The method can be performed at the data storage device 102 of FIG. 1, the data storage device 202 of FIG. 2, or the system 500 of FIG. 5, as illustrative, non-limiting examples.

A command is received that indicates a memory access operation as a read operation, a write operation, or an erase operation, at 802. A first set of parameter values associated with a first physical block of a memory array is identified, where the first set of parameter values is identified based on a first physical location of the first physical block, at 804. For example, the first physical block may be the first physical block 152 of FIG. 1, and the first set of parameters 122 of FIG. 1 may be identified based on the physical location of the first physical block 152 of FIG. 1.

A memory access operation is initiated with respect to the first physical block in accordance with the first set of parameter values, at 806. The first set of parameter values are communicated or written to at least one register that is accessible to control circuitry, at 808. The first set of parameter values may be read from a metadata storage area of the memory array by a controller, such as by the controller 112 of FIG. 1, reading the metadata based on physical location 120. The metadata may be read from the memory array using a memory access operation that does not use metadata or that uses metadata that is already stored in a controller's Random Access Memory (RAM). The first set of parameter values may be written to the operations register(s) 126 of FIG. 1. The memory access operation is indicated to control circuitry, at 810, to perform the memory access operation using the first set of parameters.

As an example, the first physical location may be an edge region of the memory array, such as the memory array 210 of FIG. 2. The first set of parameter values associated with the first physical block may correspond to the edge region of the memory array, and a second set of parameter values different than the first set of parameter values may correspond to a central region of the memory array.

As another example, the first physical location may be within an edge area of a plane of the memory array, such as the edge area 330 or 334 of FIG. 3. The first set of parameter values may correspond to the edge area of the plane of the memory array and a second set of parameter values may correspond to a central area of the plane of the memory array, such as the central area 332.

Based on a result of the memory access operation, at least one parameter of the first set of parameters may be modified, at 812. For example, a determination may be made that an improved performance may be achieved by adjusting a value of one or more physical location-based parameters. The adjusted parameter value may be stored in association with the first set of parameters, at 814, for use during subsequent memory access operations for the first physical block.

The first set of parameter values may be associated with a first location-based group of physical blocks including the first physical block. Modifying a parameter value based on the result of the memory access operation for the first physical block may cause the modified parameter value to be used for subsequent access operations for other physical blocks in the first location-based group. A second command may be received to perform a second memory access operation at a second physical block of the first location-based group of physical blocks that includes the first physical block, at 816. The at least one modified parameter may be provided to be accessed by the control circuitry to perform the second memory access operation at the second physical block, at 818.

A second set of parameter values may be associated with a second location-based group of physical blocks that does not include the first physical block, such as the second set of parameters 124 of FIG. 1. A second physical block of the second location-based group of physical blocks may have a substantially similar design as the first physical block but the second physical block may have a different physical characteristic than the first physical block as a result of a difference in physical locations. For example, the second physical block 154 of FIG. 1 may have a same design as the first physical block 152 of FIG. 1 but may have different physical characteristics as a result of being in a different location than the first physical block 152.

Because of a difference in physical locations, parameter modifications applied to the first location-based group of physical blocks may not be applied to a second location-based group of physical blocks. For example, adjusting the at least one parameter based on the result of the first memory access operation may cause a second memory access request to a second physical block in the first location-based group to use the modified value, but may not cause a third memory access request to a third physical block in the second location-based group to use the modified value.

Figure 9:
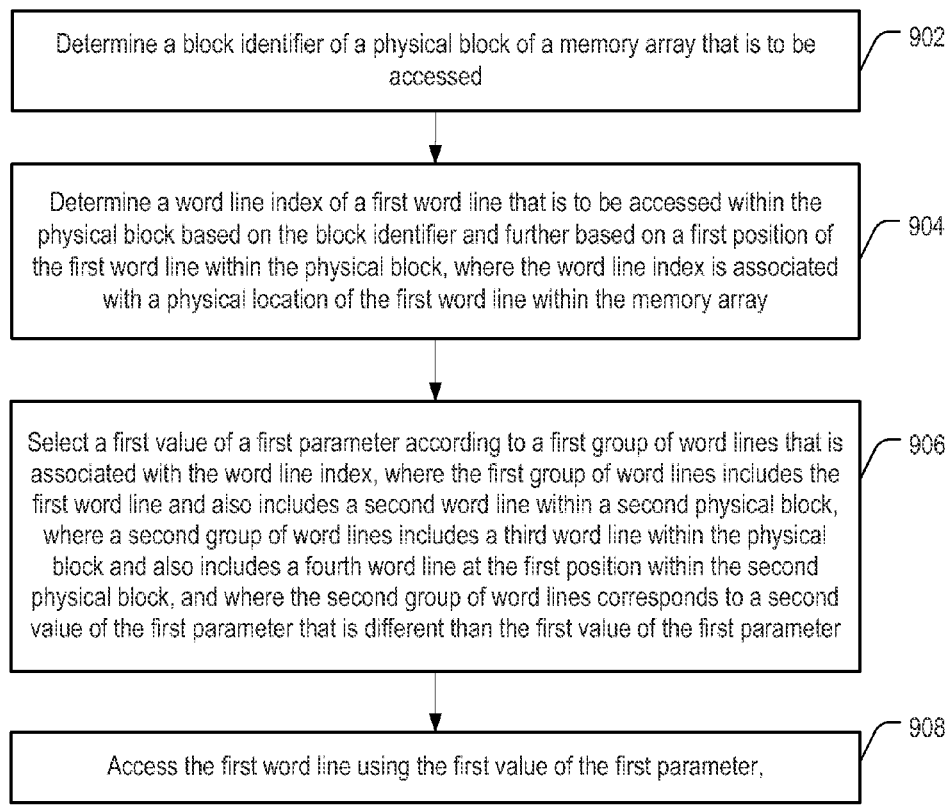
FIG. 9 is a flow diagram of an embodiment of a method of accessing a word line of a memory array using values of one or more parameters based on a physical location of the word line.

FIG. 9 is a flow diagram of an embodiment of a method of accessing a word line of a memory array using values of one or more parameters based on a physical location of the word line. A block identifier of a physical block of a memory array that is to be accessed is determined, at 902. For example, the block identifier may be a number 'k' of the physical block within a memory array having 'n' physical blocks, where $0 \leq k < n$.

A word line index of a first word line that is to be accessed within the physical block is determined based on the block identifier and further based on a first position of the first word line within the physical block, at 904. The word line index is associated with a physical location of the first word line within the memory array. For example, the word line index may be given as $k \times m + j$, where 'k' is a block number of the physical block, 'm' is a number of word lines in each block, and 'j' indicates the position of the word line within the block, and $0 \leq j < m$.

A first value of a first parameter is selected according to a first group of word lines that is associated with the word line index, at 906. The first group of word lines includes the first word line and also includes a second word line within a second physical block. A second group of word lines includes a third word line within the physical block and also includes a fourth word line at the first position within the second physical block. The second group of word lines corresponds to a second value of the first parameter that is different than the first value of the first parameter. To illustrate, the first word line may be at j=0, k=0, the second word line may be at j=3, k=1, the third word line may be at j=4, k=0, and the fourth word line may be at j=0, k=1. The first word line is accessed using the first value of the first parameter, at 908.

As an example, the first word line may include a first indicator, such as a tag or pointer, corresponding to the first value of the first parameter. The first word line may include a second indicator corresponding to a first value of a second parameter.

As another example, the first word line may include an indicator corresponding to a first set of values. The first set of values may include the first value of the first parameter and the first value of the second parameter. The first set of values may correspond to a first entry of a table, and the table may also include a second entry corresponding to a second set of values. The first word line and the second word line may be associated with the first entry of the table, while the third word line and the fourth word line may be associated with the second entry of the table.

Each word line may be assigned to a particular entry of the table that includes a set of parameter values that is closest to a calculated or optimal set of parameter values for the particular word line. For example, a set of parameter values corresponding to the first word line may acquired. The acquired set of parameter values may be compared to the first set of values and to the second set of values, and the first word line may be associated with the first entry of the table based on the comparison. To illustrate, the first set of parameters of the first table entry may match the acquired set of parameters more closely than the second set of parameters of the second table entry.

Although various components depicted herein are illustrated as block components and described in general terms, such components may include one or more microprocessors, state machines, or other circuits configured to enable the data storage device 102 of FIG. 1, the data storage device 202 of FIG. 2, or the system 500 of FIG. 5 to perform the particular functions attributed to such components, or any combination thereof. For example, the controller 112 of FIG. 1 may represent physical components, such as hardware controllers, state machines, logic circuits, or other structures to enable the data storage device 102 of FIG. 1 to perform memory operations using physical location-based parameter values.

For example, the flash management system 114 may be implemented using a microprocessor or microcontroller programmed to determine one or more parameter values to be loaded into the operations register(s) 126 based on a physical location of a physical block to be accessed. In a particular embodiment, the flash management system 114 of FIG. 1 includes executable instructions that are executed by a processor and the instructions are stored in the memory array 104. Alternatively, or in addition, executable instructions that are executed by a processor that may be included in the controller 112 may be stored in a separate memory location that is not part of the memory array 104, such as at a read-only memory (ROM) (not shown).

In a particular embodiment, the data storage device 102 of FIG. 1, the data storage device 202 of FIG. 2, the flash memory device 520 of FIG. 5, or any combination thereof, may be a portable device configured to be selectively coupled to one or more external devices, such as the host device 501 of FIG. 5. However, in other embodiments, the data storage device 102 or 202 or the flash memory device 520 may be attached or embedded within one or more host devices, such as within a housing of a portable communication device. For example, the data storage device 102 may be within a packaged apparatus such as a wireless telephone, personal digital assistant (PDA), gaming device or console, portable navigation device, or other device that uses internal non-volatile memory. The data storage device 102 may include a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable (OTP) memory, or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   determining a value of a first parameter for a first word line within a first physical block of a memory;
   comparing the value to a set of values including a first value of the first parameter and a second value of the first parameter;
   associating the first word line with the first value in response to determining that a first difference between the value and the first value is less than a second difference between the value and the second value;
   determining a block identifier of the first physical block;
   determining a word line index of the first word line based on the block identifier and further based on a first position of the first word line within the first physical block, wherein the word line index is associated with a first physical location of the first word line within the memory; and
   accessing the first word line using the first value of the first parameter, wherein a first group of word lines that is associated with the word line index includes the first word line and also includes a second word line within a second physical block of the memory, wherein a second group of word lines includes a third word line within the first physical block and also includes a fourth word line at the first position within the second physical block, and wherein the second group of word lines corresponds to the second value.

2. The method of claim 1, wherein the first parameter corresponds to a programming step size of a programming signal, and wherein accessing the first word line includes writing data to the first word line based on the first value of the programming step size.

3. The method of claim 1, wherein the first word line includes a first indicator corresponding to the first value of the first parameter, and wherein the first word line further includes a second indicator corresponding to a third value of a second parameter.

4. The method of claim 1, wherein the first word line includes an indicator corresponding to a first set of values, and wherein the first set of values includes the first value of the first parameter and a third value of a second parameter.

5. The method of claim 4, wherein the first set of values corresponds to a first entry of a table, and wherein the table also includes a second entry corresponding to a second set of values.

6. The method of claim 5, wherein the first word line and the second word line are associated with the first entry of the table, and wherein the third word line and the fourth word line are associated with the second entry of the table.

7. The method of claim 6, wherein associating the first word line with the first value of the first parameter includes associating the first word line with the first entry of the table.

8. The method of claim 1, wherein the first value comprises a physical location-dependent parameter value that is at least partially based on a second physical location of the first physical block within the memory and that is to be used in an error decoding operation.

9. The method of claim 1, wherein the second value comprises a time-dependent parameter value.

10. The method of claim 1, wherein the memory includes a three-dimensional array of memory cells, and wherein the memory is included in a data storage device that includes circuitry associated with operation of the three-dimensional array of memory cells.

11. A data storage device comprising:
a memory; and
a controller, wherein the controller is coupled to the memory, and wherein the controller is configured to determine a value of a first parameter for a first word line within a first physical block of the memory, to compare the value to a set of values that includes a first value of the first parameter and a second value of the first parameter, to associate the first word line with the first value in response to determining that a first difference between the value and the first value is less than a second difference between the value and the second value, to determine a block identifier of the first physical block, and to determine a word line index of the first word line based on the block identifier and further based on a first position of the first word line within the first physical block, wherein the word line index is associated with a first physical location of the first word line within the memory, wherein the controller is further configured to access the first word line using the first value of the first parameter, wherein a first group of word lines that is associated with the word line index includes the first word line and also includes a second word line within a second physical block of the memory, and wherein a second group of word lines includes a third word line within the first physical block and also includes a fourth word line at the first position within the second physical block, and wherein the second group of word lines corresponds to the second value.

12. The data storage device of claim 11, wherein the first wordline includes a first indicator corresponding to the first value of the first parameter.

13. The data storage device of claim 12, wherein the first word line includes a second indicator corresponding to a third value of a second parameter.

14. The data storage device of claim 11, wherein the first word line includes an indicator corresponding to a first set of values, and wherein the first set of values includes the first value of the first parameter and a third value of a second parameter.

15. The data storage device of claim 14, wherein the first set of values corresponds to a first entry of a table, and wherein the table also includes a second entry corresponding to a second set of values.

16. The data storage device of claim 15, wherein the first word line and the second word line are associated with the first entry of the table, and wherein the third word line and the fourth word line are associated with the second entry of the table.

17. The data storage device of claim 16, wherein the controller is further configured to associate the first word line with the first entry of the table.

18. The data storage device of claim 11, wherein the first value comprises a physical location-dependent parameter value that is at least partially based on a second physical location of the first physical block within the memory and that is to be used in an error decoding operation.

19. The data storage device of claim 11, wherein the second value is comprises a time-dependent parameter value.

20. The data storage device of claim 11, wherein the memory includes a three-dimensional array of memory cells, and further comprising circuitry associated with operation of the three-dimensional array of memory cells.

* * * * *

UNITED STATES PATENT AND TRADEMARK OFFICE
CERTIFICATE OF CORRECTION

| | | |
|---|---|---|
| PATENT NO. | : 9,141,524 B2 | Page 1 of 1 |
| APPLICATION NO. | : 14/489024 | |
| DATED | : September 22, 2015 | |
| INVENTOR(S) | : Idan Alrod et al. | |

It is certified that error appears in the above-identified patent and that said Letters Patent is hereby corrected as shown below:

In the Claims,

Claim 12 (Column 18, Line 5) "wordline includes a first indicator corresponding to the first" should be --word line includes a first indicator corresponding to the first--.

Claim 19 (Column 18, Line 33) "value is comprises a time-dependent parameter value" should be --value comprises a time-dependent parameter value--.

Signed and Sealed this
Twenty-second Day of March, 2016

Michelle K. Lee
*Director of the United States Patent and Trademark Office*